United States Patent
Pantazis (10) Patent No.: US 11,480,623 B2
(45) Date of Patent: Oct. 25, 2022

(54) APPARATUS AND METHOD FOR PREDICTING A REMAINING BATTERY LIFE IN A DEVICE

(71) Applicant: SAMSUNG ELECTRONICS CO., LTD., Suwon-si (KR)

(72) Inventor: Omiros Pantazis, Staines (GB)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 64 days.

(21) Appl. No.: 17/084,226

(22) Filed: Oct. 29, 2020

(65) Prior Publication Data

US 2021/0123982 A1 Apr. 29, 2021

(30) Foreign Application Priority Data

Oct. 29, 2019 (GR) .............................. 20190100479
Apr. 17, 2020 (GB) ..................................... 2005620

(51) Int. Cl.
*G06F 11/30* (2006.01)
*G01R 31/392* (2019.01)
*G01R 31/36* (2020.01)

(52) U.S. Cl.
CPC ....... *G01R 31/392* (2019.01); *G01R 31/3646* (2019.01); *G01R 31/3648* (2013.01)

(58) Field of Classification Search
CPC ............ G01R 31/3646; G01R 31/3648; G01R 31/392
See application file for complete search history.

(56) References Cited

U.S. PATENT DOCUMENTS

| 10,120,004 | B1 | 11/2018 | Tsai et al. |
| 2011/0125509 | A1 | 5/2011 | Lidstrom et al. |
| 2014/0244191 | A1* | 8/2014 | Oka ................... G01R 21/133 |
| | | | 702/61 |
| 2016/0073351 | A1 | 3/2016 | Cardozo et al. |
| 2018/0115871 | A1 | 4/2018 | Bacarella et al. |
| 2019/0113577 | A1 | 4/2019 | Severson et al. |

(Continued)

FOREIGN PATENT DOCUMENTS

| EP | 2309363 A1 | 4/2011 |
| KR | 1020130122737 A | 11/2013 |

(Continued)

OTHER PUBLICATIONS

Matt Adams, "Google explains how it makes personalized battery life predictions", Android Authority, Nov. 23, 2017, https://www.androidauthority.com/google-pixel-battery-life-estimation-817194/.

(Continued)

*Primary Examiner* — Phuong Huynh
(74) *Attorney, Agent, or Firm* — Sughrue Mion, PLLC (57) ABSTRACT

A method of predicting a remaining battery life in a device is provided. The method includes obtaining battery state information indicative of a current state of a charge of a battery, the battery being configured to supply power to a device; predicting, by using a machine learning algorithm, a remaining battery life of the device on which a specific application is to be executed, based on the obtained battery state information; and providing, to a user, an indication of the predicted remaining battery life.

20 Claims, 5 Drawing Sheets

(56) References Cited

U.S. PATENT DOCUMENTS

2019/0251580 A1  8/2019  Finkel et al.

FOREIGN PATENT DOCUMENTS

| | | |
|---|---|---|
| KR | 101387769 B1 | 4/2014 |
| KR | 101799461 B1 | 11/2017 |

OTHER PUBLICATIONS

Communication dated Dec. 16, 2020 issued by the Intellectual Property Office of the United Kingdom in Application No. GB2005620.6.

International Search Report and Written Opinion dated Feb. 19, 2021, issued by the International Searching Authority in counterpart International Application No. PCT/KR2020/014891.

* cited by examiner

APPARATUS AND METHOD FOR PREDICTING A REMAINING BATTERY LIFE IN A DEVICE

CROSS-REFERENCE TO RELATED APPLICATION(S)

This application claims priorities to Greek Patent Application. No. 20190100479, filed on Oct. 29, 2019, in the Greek Patent Office, and United Kingdom Application No. 2005620.6, filed on Apr. 17, 2020, in the Intellectual Property Office of the United Kingdom, the disclosures of which are herein incorporated by reference in their entireties.

BACKGROUND

1. Field

The disclosure relates to an apparatus and a method for predicting a remaining battery life in a device.

2. Description of Related Art

Recent improvements in battery technology have enabled mobile devices, such as smartphones, wearable electronic devices, and tablet computers, to operate for longer time before battery charging. However, despite these improvements, users may still find that the battery capacity is insufficient in certain situations, such as when running power consuming applications or when a suitable charging facility is unavailable for some time, such as when travelling. To help users to plan accordingly, devices typically provide a generic estimation of the remaining battery life based on current conditions. More recently, machine learning has been used to estimate the remaining battery life based on historical battery usage patterns for particular days and times. However, there is still a need for a method of predicting the remaining battery life more accurately.

SUMMARY

Provided are an apparatus and a method for predicting a remaining battery life in a device more with higher accuracy and/or reduced computation complexity.

In accordance with an aspect of the disclosure, there is provided a method of predicting a remaining battery life in a device, the method including: obtaining battery state information indicative of a current state of a charge of a battery, the battery being configured to supply power to a device; predicting, by using a machine learning algorithm, a remaining battery life of the device on which a specific application is to be executed, based on the obtained battery state information; and providing, to a user, an indication of the predicted remaining battery life.

The predicting may include predicting the remaining battery life further based on information relating to a previous pattern of usage of the device.

The method may further include identifying the user of the device, from among a plurality of users; and retrieving stored information relating to a previous pattern of usage of the device by the identified user, as the information relating to the previous pattern of usage of the device.

The predicting the remaining battery life further based on the information relating to the previous pattern of usage of the device may include recording information relating to a pattern of usage of the device by the user and an associated rate of power consumption; and training the machine learning algorithm based on the recorded information.

The predicting the remaining battery life further based on the information relating to the previous pattern of usage of the device may include inputting the information to the machine learning algorithm.

The predicting the remaining battery life further based on the information relating to the previous pattern of usage of the device may include assigning, by using a clustering algorithm, the user to a cluster among a plurality of clusters based on the information relating to the previous pattern of usage of the device, wherein each cluster of the plurality of clusters relates to a group of users who exhibit similar patterns of usage.

An identifier of the assigned cluster may be provided as an input to the machine learning algorithm.

The method may further include obtaining the machine learning algorithm by retrieving one of a plurality of machine learning algorithms from a server according to the cluster to which the user is assigned, each of the plurality of machine learning algorithms corresponding to one of the plurality of clusters.

The predicting may include providing, to the machine learning algorithm, an input that is indicative of the specific application, among a plurality of applications executable by the device.

The method may further include: predicting, by using the machine learning algorithm, a respective remaining battery life for each of the plurality of applications to be executed by the device, wherein providing includes providing, to the user, an indication of the predicted respective remaining battery life for each of the plurality of applications.

The providing may include displaying the respective remaining battery life for each of the plurality of applications in a vicinity of an icon for launching each of the plurality of applications.

The method may further include launching the specific application in response to a user command.

The method may further include changing at least one of a setting of the specific application or a setting of the device based on a user input; predicting, by using the machine learning algorithm, the remaining battery life of the device on which the specific application is to be executed based on the changed setting; and providing, to the user, an indication of the remaining battery life based on the changed setting.

The predicting may include inputting the obtained battery state information to the machine learning algorithm.

The predicting may include obtaining, by using the machine learning algorithm, a predicted rate of power consumption by the device based on execution of the specific application; and predicting the remaining battery life based on the obtained battery state information and the predicted rate of power consumption.

The predicting may include inputting, to the machine learning algorithm, operating state information relating to a current operating state of the device.

The operating state information may be indicative of a computational burden on the device prior to execution of the specific application.

The method may further include obtaining the machine learning algorithm by retrieving one of a plurality of machine learning algorithms from a server based on a type of the device, each of the plurality of machine learning algorithms relating to different device type.

The specific application may include a game application.

In accordance with an aspect of the disclosure, there is provided a non-transitory computer-readable storage medium configured to store computer program instructions which, when executed by one or more processors, cause the one or more processors to perform: obtaining battery state information indicative of a current state of a charge of a battery, the battery being configured to supply power to a device; predicting, by using a machine learning algorithm, a remaining battery life of the device on which a specific application is to be executed, based on the obtained battery state information; and providing, to a user, an indication of the predicted remaining battery life.

In accordance with an aspect of the disclosure, there is provided an apparatus for predicting a remaining battery life in a device, the apparatus including: one or more processors; and a memory configured to store computer program instructions which, when executed on the one or more processors, cause the one or more processors to: obtain battery state information indicative of a current state of a charge of a battery, the battery being configured to supply power to a device; predict, by using a machine learning algorithm, a remaining battery life of the device on which a specific application is to be executed, based on the obtained battery state information; and provide, to a user, an indication of the predicted remaining battery life.

BRIEF DESCRIPTION OF THE FIGURES

The above and other aspects, features, and advantages of certain embodiments of the disclosure will be more apparent from the following description taken in conjunction with the accompanying drawings, in which.

DETAILED DESCRIPTION

In the following detailed description, only certain embodiments of the disclosure have been shown and described, simply by way of illustration. As those skilled in the art would understand, the described embodiments may be modified in various different ways without departing from the scope of the disclosure. Accordingly, the drawings and description are to be regarded as illustrative in nature and not restrictive. Like reference numerals denote like elements throughout the specification and the drawings.

Figure 1:
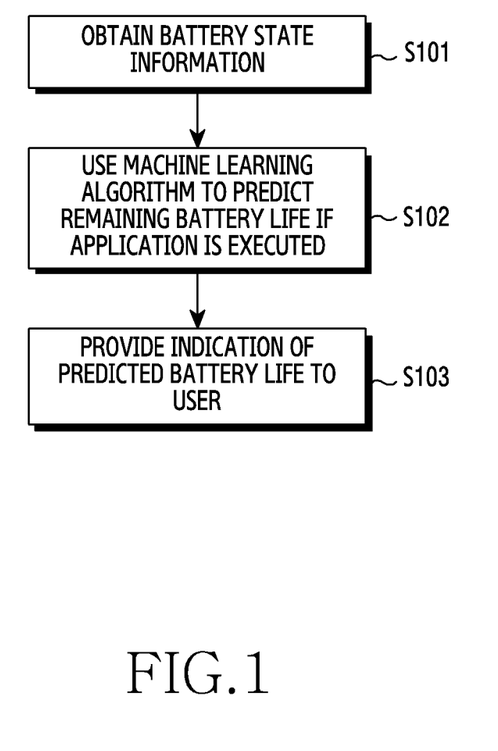
FIG. 1 is a flowchart illustrating a method of predicting remaining battery life in a device, according to an embodiment.

Referring to FIG. 1, a method of predicting a remaining battery life in a device according to an embodiment is illustrated. In the present embodiment, the method may be performed at a mobile device, for example, a smartphone handset or a tablet computer, to provide a user with an indication of a remaining battery life if a certain application is executed on the device. In other embodiments, the method may be implemented at a cloud server, for example. The method may be implemented via execution of suitable computer program instructions stored in a memory.

In operation S101, battery state information indicative of a current state of a charge of a battery is obtained. The battery may be a rechargeable battery or a non-rechargeable battery. Depending on an embodiment, the battery state information may represent the current state of a charge in various methods. For example, in an embodiment, the battery state information may represent the current state of charge in an absolute term, such as a level of an electrical charge of the battery measured in milliamps per hour (mAh). In another embodiment, the battery state information may represent the current state of charge in a relative term, such as a percentage of a current level to a total capacity of the battery.

Next, in operation S102, a machine learning algorithm is used to predict a remaining battery life based on an assumption of a scenario in which a specific application is executed on the device. The predicted remaining battery life may indicate, for example, a predicted remaining runtime of the battery, but the disclosure is not limited thereto. For example, the predicted remaining battery life may indicate a percentage of a remaining battery capacity. Here, the prediction of the remaining battery life takes into account the current state of a charge of the battery, to predict the remaining time for which the device will be capable of operating if the specific application is executed. In other words, the prediction is based on the obtained battery state information. The machine learning algorithm is trained to predict the remaining battery life.

The machine learning algorithm may be trained using information about power consumption in the device required when a particular application in is being executed. In this manner, the machine learning algorithm may provide an accurate prediction about the remaining battery life of the device, in the event that the same particular application is to be executed on the device. In other words, the prediction takes into account an expected rate at which the device consumes power when the device executes the particular application. The rate at which the device consumes power may vary significantly when different applications are running on the device. According to an embodiment, by considering the expected power consumption rate corresponding to a particular application, a more accurate prediction of the remaining battery life may be obtained. Furthermore, the training data may be obtained from a large number of users, to increase the accuracy of the prediction.

In some embodiments, the machine learning algorithm may be trained to predict the remaining battery life differently for different types of devices. For example, the machine learning may be provided with one or more input parameters that identify the device, and/or relevant properties of the device such as the type of a processor and the capacity of the battery. In other embodiments, the machine learning algorithm may be trained for one specific type of device, such as a particular make and a model of a device.

In operation S103, an indication of the predicted remaining battery life is provided to the user, for example, in the form of an audio and/or a visual output. By providing the user with an indication of the predicted battery life for executing a specific application, the user may take an informed decision as to whether or not to launch the specific application on the device. In this way, the user may plan his or her usage of the device based on the predicted battery life according to embodiments of the disclosure. Accordingly, embodiments of the disclosure may avoid a scenario in which the user unwittingly drains the battery too quickly before the user can recharge the battery, which may result in the device shutting down while the application is still running. In contrast to the method shown in FIG. 1, related art methods predict the remaining battery life typically by using a linear extrapolation of the current rate of power consumption, without taking into consideration the effect of launching a different application on the rate at which the device consumes power.

In an embodiment, the machine learning algorithm is trained to predict the remaining battery life if one particular application is executed on a certain type of device. In other words, the algorithm is trained specifically for one combination of a device and an application. However, in other embodiments, the machine learning algorithm may be trained to provide predictions of the remaining battery life for other devices and/or other applications. For example, in an embodiment the machine, a machine learning algorithm is configured to receive an input vector that identifies one of a plurality of applications, and is trained to predict the remaining battery life if any of the plurality of applications are executed.

Figure 2:
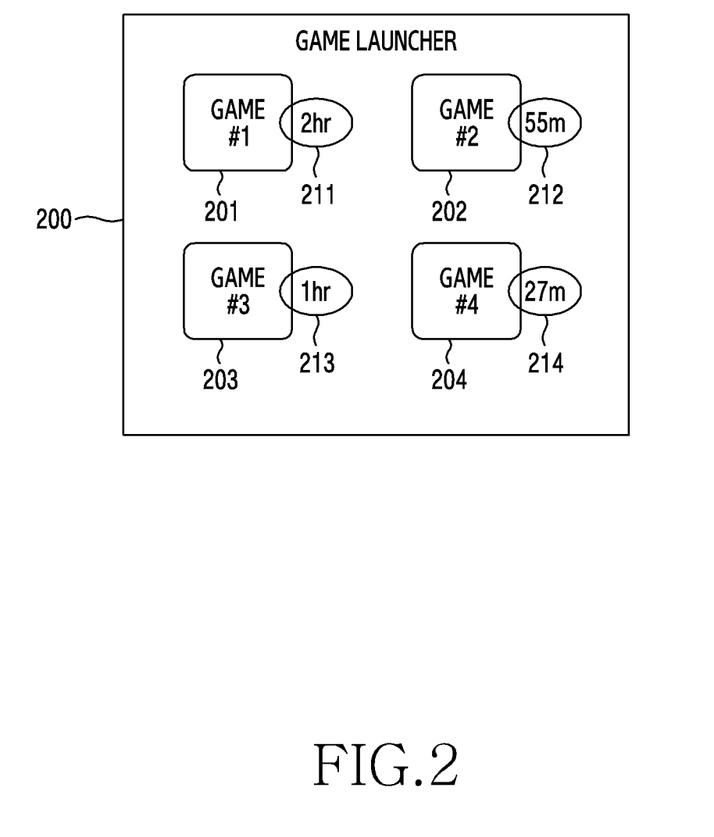
FIG. 2 illustrates a screen of a user interface for displaying a predicted remaining battery life, according to an embodiment.

FIG. 2 illustrates a screen of a user interface for displaying the predicted remaining battery life for each of a plurality of applications, according to an embodiment. The user interface screen 200 comprises a plurality of icons 201, 202, 203, 204 which may be used to launch a corresponding one of a plurality of gaming applications. In this embodiment of FIG. 2, four icons 201, 202, 203, 204 are illustrated, but it will be appreciated by a person of ordinary skill in the art that in other embodiments the machine learning algorithm may be trained to predict the remaining battery life for any number of applications, and the number of icons in the user interface screen may be changed accordingly. Also, while the embodiment of FIG. 2 is illustrated in relation to gaming applications, in other embodiments the machine learning algorithm may be used to predict the remaining battery life for other types of applications, such as a video and/or an audio player, a social networking application, a word processing application, and the like, and the plurality of applications corresponding to icons in the user interface screen 200 may belong to different categories of applications.

In an embodiment, the machine learning algorithm may be used to predict a respective remaining battery life in each of a plurality of scenarios in which a different one of the plurality of applications is executed on the device. Depending on an embodiment, the prediction may be made automatically for each application that is installed on the device, or may only be made for a certain subset of applications that are installed on the device. For example, in the embodiment illustrated in FIG. 2, the user interface screen 200 is a 'game launcher' screen in which the user may select one of a plurality of games to be launched on the device. When the user opens the 'game launcher', the machine learning algorithm may be used to predict the remaining battery life for each of the plurality of games if each game is launched and the prediction results are displayed as shown in FIG. 2. In this embodiment, the machine learning algorithm is used to make a prediction for only the applications that may be selected by the user in the 'game launcher' screen. Therefore, the embodiment of FIG. 2 may avoid wasting processing resources to make predictions for other applications that are installed on the device but cannot be accessed through the game launcher screen.

The indication of the predicted remaining battery life for each application is provided by displaying numerical information (e.g., 2 hr of the remaining battery life 211, 55*m* of the remaining battery life 212, 1 hr of the remaining battery life 213, 27*m* of the remaining battery life 214) in the vicinity of the respective icon 201, 202, 203, 204 for launching the corresponding application. It will be appreciated that this is merely one example of providing the indication to the user, and should not be construed as limiting. For example, in another embodiment, the indication may not be displayed alongside each icon, but may only be displayed in response to user input, for example, by selecting an option in a sub-menu to view the predicted battery life for a certain one of the applications. Also, the numerical information is not limited to the runtime of the battery but includes any numerical information suitable for indicating the remaining battery life (e.g., percentage of remaining battery capacity). The indication of the predicted remaining battery life is not limited to the numerical information, but may be indicated in various other formats (e.g., different colors representing different remaining battery capacity levels).

Referring back to FIG. 1, the information that is obtained in S101 may be taken into account in various manners in S102, depending on an embodiment. For example, in an embodiment, the battery state information that is obtained in S101 may be provided to the machine learning algorithm as an input, such that the output of the machine learning algorithm automatically takes into account the current level of charge. The machine learning algorithm may output the prediction result. For example, the prediction result may be output in a form of a predicted time period until the battery will be drained (e.g., completely drained) if the device is continually operated while running the specific application. In an embodiment, the output of the machine learning algorithm may be provided directly to the user without any further processing.

In an embodiment, based on information about the current battery state that is provided to the machine learning algorithm, the output of the machine learning algorithm may take into account a change that may occur in the rate of power consumption at different battery levels, for example, a result of a power-saving mode being activated at a low battery charge state (e.g., less than 10% battery charge).

In an alternative embodiment, the machine learning algorithm may not take into account the current state of charge of the battery. Instead, in S102, the machine learning algorithm may be configured to output a result in the form of a predicted rate of power consumption by the device in the event that the specific application is to be executed. In this embodiment, the machine learning algorithm may be used to obtain the predicted rate of power consumption in S102 before the battery state information is obtained in S101. In other words, S101 may be performed after S102, or concurrently with S102. Then, the remaining battery life may be obtained based on the obtained battery state information and the predicted rate of power consumption. For example, if the battery state information is represented in terms of the remaining amount of a charge in mAh, X, and the predicted rate of power consumption is represented in terms of a number of milliamps (mA), N, that would be consumed during one hour when executing the specific application, the remaining battery time may be obtained by dividing X by N. This approach may allow the machine learning algorithm to be simplified, since the number of inputs and hence the complexity of the model may be reduced.

In some embodiments, using the machine learning algorithm to predict the remaining battery life may include inputting, to the machine learning algorithm, operating state information relating to a current operating state of the device. For example, the operating state information may indicate whether other applications are running on the device, whether certain device features are turned on, such as Bluetooth or WiFi, the current device settings such as a brightness level, a power saving mode and the like, and/or may indicate the current level of a computational burden on the device prior to execution of the specific application. The prediction result of the battery life that is obtained by using the machine learning algorithm may be based on the current operating state of the device, and therefore, may provide a more accurate prediction of the remaining battery life.

Figure 3:
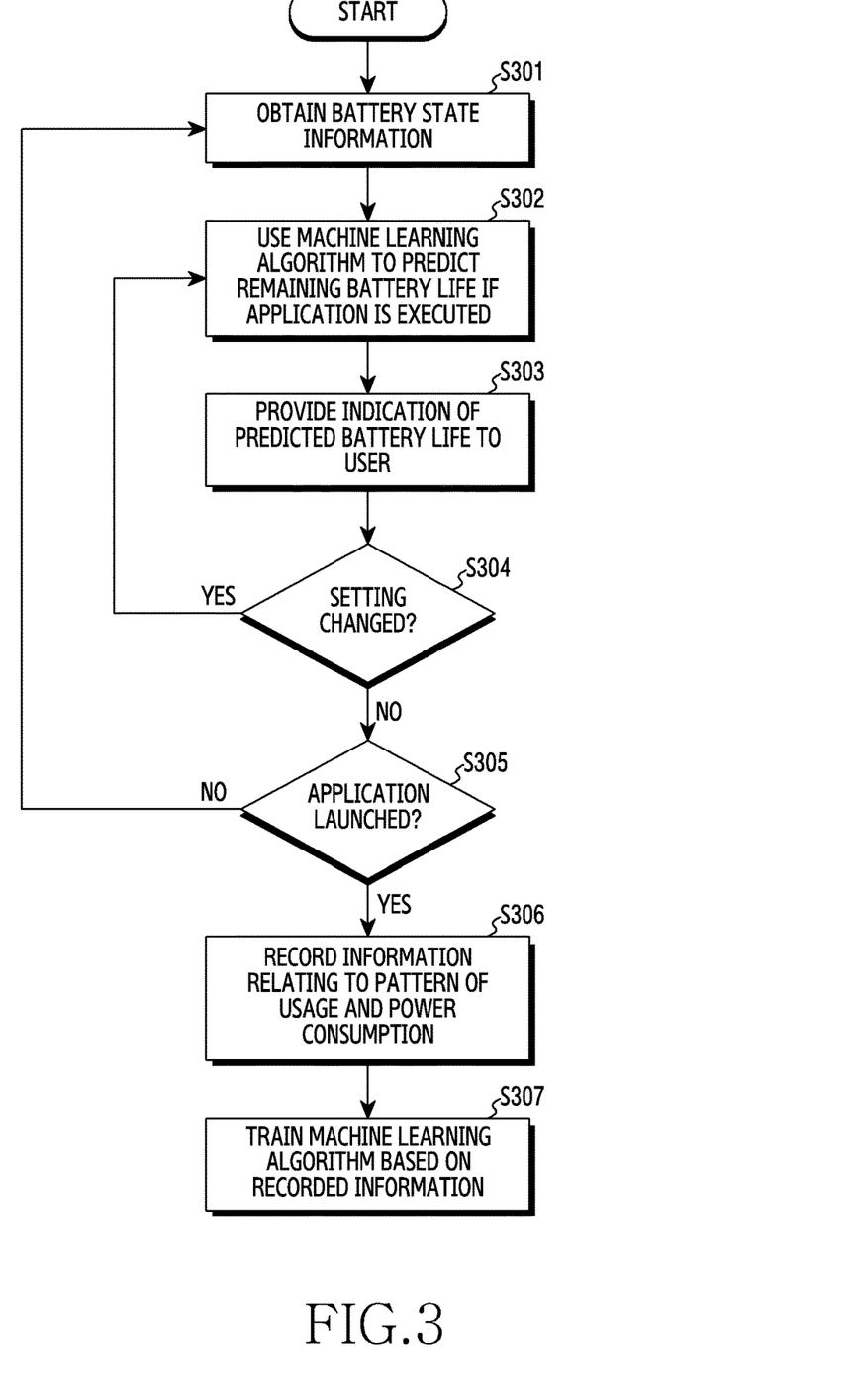
FIG. 3 is a flowchart illustrating a method of predicting remaining battery life of a device using a model trained based on a past usage pattern of the device, according to an embodiment.

Referring now to FIG. 3, a method of predicting remaining battery life using a model trained based on a past usage pattern of the device according to an embodiment is illustrated. In an embodiment, the machine learning algorithm is trained using data about a previous pattern of usage of the device, such that a more accurate prediction may be obtained for that particular device. In some embodiments, different versions of the machine learning algorithm may be trained for a plurality of different users of the same device, and the method may include identifying a current user of the device, from among the plurality of users. In these embodiments, the machine learning algorithm may be trained using stored information relating to a previous pattern of usage of the device by the identified user. However, in other embodiments, the machine learning algorithm may be trained using any data about the previous pattern of usage of the device, without distinguishing between different users.

In FIGS. 3, S301, S302 and S303 may be performed in a similar manner to S101, S102 and S103 of FIG. 1, and for the sake of brevity, a detailed explanation will not be repeated here. In an embodiment, after a prediction result is obtained in S302 and provided to the user in S303, the user may decide whether to adjust a setting of the specific application and/or a setting of the device before launching the application. For example, if the predicted battery life is shorter than a target battery life (e.g., a battery capacity level desired by the user), the user may choose to change a setting of the device and/or a setting of the application settings so as to extend the battery life while launching the application. If the predicted battery life is longer than the target battery life (e.g., sufficient for the user's need), the user may maintain the current setting for the device and/or the application or choose to adjust the current setting to make full use of the available battery power, for example, by switching to a higher graphics setting in the game application.

Accordingly, in S304, it is determined whether the user has changed the setting of the application and/or of the device. If any setting has been changed, the method returns to S302 and uses the machine learning algorithm to obtain an updated prediction of the remaining battery life in a scenario in which the specific application is executed on the device according to the changed setting and provide an indication to the user of the updated prediction of the remaining battery life in S303.

In some embodiments, when it is determined that the setting is changed in S304, the method may return to S301 instead of S302, to obtain more up-to-date battery state information. For example, if an amount of time that has elapsed between the previous battery state information being obtained in S301 and the device and/or application setting being changed in S304 is shorter than a threshold time period, it may be assumed that the previous battery state information is still sufficiently accurate, and the method may return to S302. On the other hand, if the time that has elapsed between the previous battery state information being obtained in S301 and the device and/or application setting being changed in S304 is greater than the threshold time period, the previous battery state information may no longer be an accurate representation of the current state of charge of the battery, and the method may return to S301 to obtain more up-to-date (or latest) battery state information.

In S305, it is determined whether the application is launched. The application may be launched based on the predicted battery life, in response to a user command. In S306, based on an interaction between the user and the device, information relating to a pattern of usage of the device and an associated rate of power consumption is recorded.

The information relating to the pattern of usage of the device may be represented in different forms, depending on the application. For example, in a game application in which a user controls the movement of a character on the screen, the recorded information about the pattern of usage of the device may indicate a frequency with which the user provides an input to control the character's movement. Different users may exhibit different patterns (e.g., personal styles) in terms of how they interact with the game, which in turn may affect the number of calculations to be made within the device and accordingly the rate at which the game application consumes power. For example, one user may only move the character slowly with infrequent changes of a movement direction of the character, resulting in a slowly-changing field of view and consequently a relative low graphics processing burden on the device. Another user may tend to move the character more rapidly and change a movement direction of the character very frequently, resulting in a much higher graphics processing burden on the device.

The above example is given for illustrative purposes only to describe how different playing styles of users may affect the rate of power consumption by a game application. The same principle may be applicable to other types of application, and is not limited to user interactions with game applications. For example, when interacting with a social networking application, one user may tend to watch a high number of videos while another user may primarily use the application to share text-based messages with other users, resulting in different rates of power consumption when using the social networking application.

Referring back to FIG. 3, the information that is recorded in S306 is then used to train the machine learning algorithm in S307, so as to improve an accuracy of the battery life prediction. For example, the information may be continuously recorded in S306 while the user is interacting with the application. Then, once the user exits the application, the machine learning algorithm may be re-trained in S307 by using the data that has been collected. In some embodiments, to reduce the computational burden associated with re-training the algorithm, the re-training in S307 may only be carried out at certain regular intervals, for example, once a week, rather than in each session of the method.

Depending on an embodiment, the re-training in S307 may take place locally at the device, or may take place at a cloud server. Since re-training the machine learning algorithm may be computationally intensive, performing the re-training of S307 at a server may help to reduce the computational burden on the device, and also help to conserve battery power at the device.

A method such as the one shown in FIG. 3 may be initiated (e.g., may run for the first time), using a generic model of the machine learning algorithm. Here, the term 'generic model' refers to an initial version of the algorithm that has been trained using data from a large number of users, and as such is not specific to any individual user. Then, using a method as shown in FIG. 3, a local copy of the generic model may be trained on a device of a particular user(s), so as to fine-tune the algorithm according to the behavior of the particular user(s) of the device. This learning process may be carried out in an ongoing fashion, for example, by periodically re-training the model at regular intervals, so as to increase the accuracy of the predictions for the device.

Figure 4:
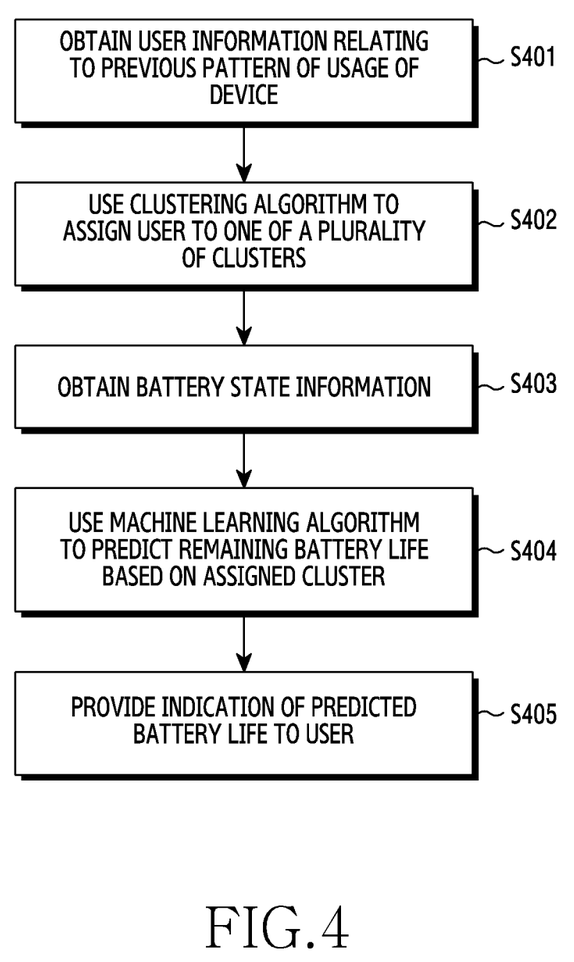
FIG. 4 is a flowchart illustrating a method of predicting remaining battery life using a generic model, according to an embodiment.

Referring now to FIG. 4, a method of predicting remaining battery life using a generic model according to an embodiment is illustrated. The method of FIG. 4 differs from the method of FIG. 3 in that the machine learning algorithm used in FIG. 3 is re-trained according to the pattern of usage that has been observed for a particular device, and/or for a particular user, whereas in FIG. 4, the machine learning algorithm is not re-trained in this manner. Instead, in the embodiment of FIG. 4, the past pattern of usage is taken into account via an additional input to the machine learning algorithm, as described in detail below.

As an example, in some embodiments, the machine learning algorithm may be configured to receive an additional input relating to the past pattern of usage of the device, for instance, in the form of a numerical value representing the historical power drain on the device during a certain number of sessions (e.g., times when the application is executed on the device). When the generic model is first installed on the device, this input may simply be based on a historical average of usage across a plurality of users. Then, once data is available for a current user of the device, for example, once information has been recorded for the current user in S306, the input may be updated according to the current user's own pattern of usage. This approach may be more computationally efficient than re-training the machine learning algorithm, because only a value of an input parameter of the machine learning algorithm needs to be updated. Another example of an additional input that relates to the past pattern of usage of the device is described below in relation to FIG. 4, in which the additional input takes the form of a cluster identifier.

In S401, information relating to a previous pattern of usage of the device is obtained. S401 may be performed in a similar manner to S306 of FIG. 3, in which information about the manner in which a user interacts with the device is collected while the specific application is running on the device.

Next, in S402, a clustering algorithm is used to assign the user to one of a plurality of clusters based on user information relating to the previous pattern of usage of the device. Here, each cluster of the plurality of clusters relates to a group of users who exhibit similar patterns of usage. Although the clusters are defined in terms of users in this embodiment, the device may not distinguish between different users in other embodiments. In other embodiments, the clustering algorithm may be used to group together devices that exhibit similar patterns of usage. The clustering according to the disclosure is not limited to the above examples and may be applied to any clustering of an element (e.g. application to be executed on the device) that may affect the rate of power consumption in the device.

When it is desired to obtain a prediction of the remaining battery life for a particular application, for example when a user opens the 'game launcher' screen shown in FIG. 2, in S403, the device obtains battery state information and then uses the machine learning algorithm to predict the remaining battery life in S404. In an embodiment, in S404, the method takes into account the cluster to which the user has been assigned by providing, to the machine learning algorithm, an input which is indicative of the assigned cluster, and the prediction result outputted by the machine learning algorithm is based on the assigned cluster. For example, the additional input to the machine learning algorithm may be in the form of an identifier which identifies the assigned cluster, for example, a cluster number 1 to n, where n is the total number of clusters.

In another embodiment, the assigned cluster may be taken into account by retrieving a corresponding version of the machine learning algorithm from a server which stores a plurality of machine learning algorithms, each relating to a different one of the plurality of clusters. In this manner, the complexity of the machine learning algorithm may be reduced since an additional input is not required. In both cases, the accuracy of the prediction may be improved since the prediction takes into account the past behavior of the user.

Figure 5:
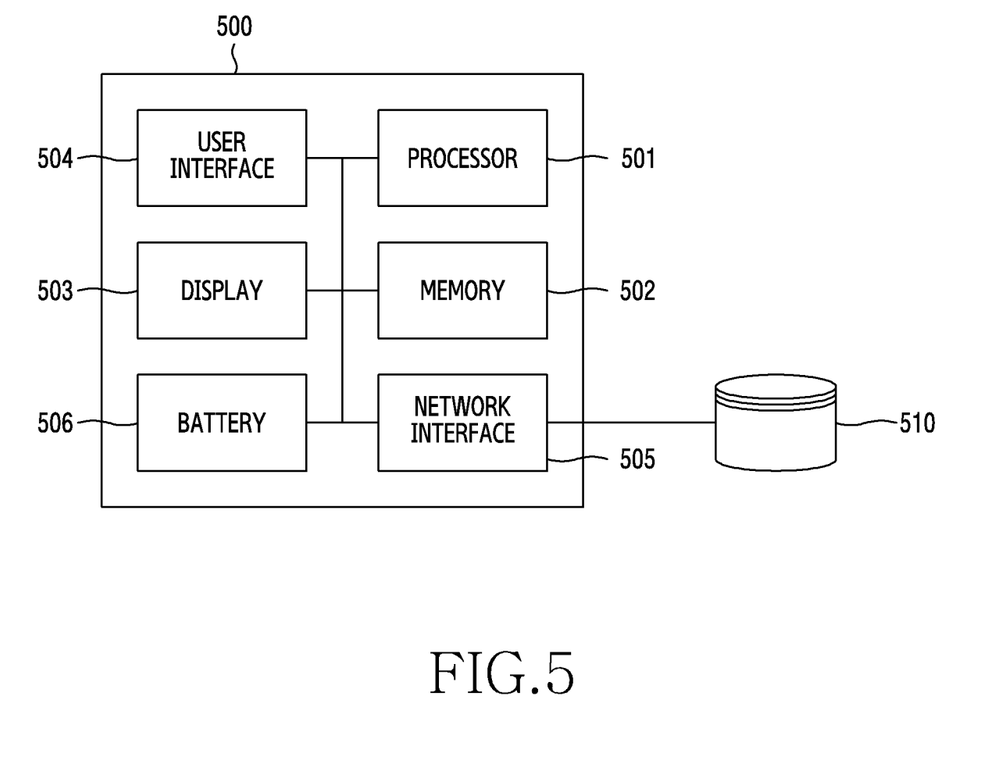
FIG. 5 illustrates a system for predicting battery life in a device, according to an embodiment.

Referring now to FIG. 5, a system for predicting a battery life in a device according to an embodiment is illustrated. The system includes a user device 500, for example, a smartphone, a wearable electronic device, and/or a tablet computer, which is powered by a battery 506. The user device includes a processor 501 configured to execute computer program instructions, and memory 502 configured to store computer program instructions which may be executed by the processor 501. The memory 502 may include a non-transitory storage, such as a solid-state non-volatile memory. It should be understood that the processor 501 may include a plurality of processing cores, and the term 'processor' used herein should be interpreted accordingly. The computer program instructions stored in the memory 502 may cause the device 500 to perform any of the methods described herein, when executed by the processor 501.

The device 500 may include a suitable output device to provide the indication of the predicted remaining battery life to a user, and in this embodiment, the output device may include a display 503. In addition, the device 500 may include a user interface 504, through which the user may interact with applications running on the device 500 as described above. When implementing a method such as the one shown in FIG. 3, the user may also use the user interface 504 to change the setting of the device and/or the application, and may use the user interface 504 to launch a selected application. Although an example of a graphical user interface is illustrated in FIG. 2, it would be appreciated that other forms of a user interface may be implemented in the user interface 504 of FIG. 5, such as a speech-recognition interface.

Furthermore, the device 500 of an embodiment may include a network interface 505 configured to communicate with a server 510 which stores a database of machine learning algorithms that may be accessed and downloaded by the device, as described above. For example, the server 510 may be a cloud server.

Embodiments of the disclosure may be implemented as a computer-readable code written on a computer-readable recording medium. The computer-readable recording medium may be any type of recording device in which data is stored in a computer-readable manner.

Examples of the computer-readable recording medium include a read only memory (ROM), a random access memory (RAM), a compact disc (CD-ROM), a magnetic tape, a floppy disc, an optical data storage, and a carrier wave (e.g., data transmission through Internet). The computer-readable recording medium may be distributed over a plurality of computer systems connected to a network so that a computer-readable code is written thereto and executed therefrom in a decentralized manner. Functional programs, codes, and code segments needed for implementing the disclosure may be easily deduced by a person of ordinary skill in the art, to which the disclosure pertains.

At least one of the components, elements, modules or units described herein may be embodied as various numbers of hardware, software and/or firmware structures that execute respective functions described above, according to an embodiment. For example, at least one of these components, elements or units may use a direct circuit structure, such as a memory, a processor, a logic circuit, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include or implemented by a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the block diagrams, communication between the components, elements or units may be performed through the bus. Functional aspects of the above embodiments may be implemented in algorithms that execute on one or more processors. Furthermore, the components, elements or units represented by a block or processing operations may employ any number of related art techniques for electronics configuration, signal processing and/or control, data processing and the like.

While the disclosure has been particularly shown and described with reference to embodiments thereof, it will be understood that various changes in form and details may be made therein without departing from the spirit and scope of the following claims.

What is claimed is:

1. A method of predicting a remaining battery life in a device, the method comprising:
   obtaining, from a battery, battery state information indicative of a current state of a charge of the battery, the battery being configured to supply power to the device;
   predicting, by using a machine learning algorithm, a remaining battery life of the device on which a specific application is to be executed, based on the obtained battery state information;
   providing an indication of the predicted remaining battery life;
   in response to the providing the indication of the predicted remaining battery life, receiving a user input to change at least one of a setting of the specific application or a setting of the device;
   changing the at least one of the setting of the specific application or the setting of the device based on the user input;
   identifying an amount of time elapsed between the battery state information being obtained and the changing of the at least one of the setting of the specific application or the setting of the device based on the user input;
   predicting, by using the machine learning algorithm, an updated remaining battery life of the device on which the specific application is to be executed based on the changed setting and the identified amount of time; and
   providing an indication of the updated remaining battery life based on the changed setting and the identified amount of time.

2. The method of claim 1, wherein the predicting the remaining battery life is further based on information relating to a previous pattern of usage of the device.

3. The method of claim 2, further comprising:
   identifying a user of the device, from among a plurality of users; and
   retrieving stored information relating to a previous pattern of usage of the device by the identified user, as the information relating to the previous pattern of usage of the device.

4. The method of claim 2, wherein the predicting the remaining battery life further based on the information relating to the previous pattern of usage of the device comprises:
   recording information relating to a pattern of usage of the device and an associated rate of power consumption; and
   training the machine learning algorithm based on the recorded information.

5. The method of claim 2, wherein the predicting the remaining battery life further based on the information relating to the previous pattern of usage of the device comprises:
   inputting the information to the machine learning algorithm.

6. The method of claim 2, wherein the predicting the remaining battery life further based on the information relating to the previous pattern of usage of the device comprises:
   assigning, by using a clustering algorithm, a user to a cluster among a plurality of clusters based on the information relating to the previous pattern of usage of the device, wherein each cluster of the plurality of clusters relates to a group of users who exhibit similar patterns of usage.

7. The method of claim 6, wherein an identifier of the assigned cluster is provided as an input to the machine learning algorithm.

8. The method of claim 6, further comprising:
   obtaining the machine learning algorithm by retrieving one of a plurality of machine learning algorithms from a server according to the cluster to which the user is assigned, each of the plurality of machine learning algorithms corresponding to one of the plurality of clusters.

9. The method of claim 1, wherein the predicting the remaining battery life comprises providing, to the machine learning algorithm, an input that is indicative of the specific application, among a plurality of applications executable by the device.

10. The method of claim 9, further comprising:
    predicting, by using the machine learning algorithm, a respective remaining battery life for each of the plurality of applications to be executed by the device,
    wherein providing comprises providing, to a user, an indication of the predicted respective remaining battery life for each of the plurality of applications.

11. The method of claim 10, wherein the providing comprises displaying the respective remaining battery life for each of the plurality of applications in a vicinity of an icon for launching each of the plurality of applications.

12. The method of claim 1, further comprising:
launching the specific application in response to a user command.

13. The method of claim 1, further comprising:
in response to the amount of time being greater than a threshold time period, obtaining updated battery state information indicative of the current state of the charge of the battery.

14. The method of claim 1, wherein the predicting the remaining battery life of the device comprises inputting the obtained battery state information to the machine learning algorithm.

15. The method of claim 1, wherein the predicting the remaining battery life of the device comprises:
obtaining, by using the machine learning algorithm, a predicted rate of power consumption by the device based on execution of the specific application; and
predicting the remaining battery life based on the obtained battery state information and the predicted rate of power consumption.

16. The method of claim 1, wherein the predicting the remaining battery life of the device comprises inputting, to the machine learning algorithm, operating state information relating to a current operating state of the device.

17. The method of claim 16, wherein the operating state information is indicative of a computational burden on the device prior to execution of the specific application.

18. The method of claim 1, further comprising:
obtaining the machine learning algorithm by retrieving one of a plurality of machine learning algorithms from a server based on a type of the device, each of the plurality of machine learning algorithms relating to a different device type.

19. A non-transitory computer-readable storage medium configured to store computer program instructions which, when executed by one or more processors, cause the one or more processors to perform:
obtaining battery state information indicative of a current state of a charge of a battery, the battery being configured to supply power to a device;
predicting, by using a machine learning algorithm, a remaining battery life of the device on which a specific application is to be executed, based on the obtained battery state information;
providing, to a user, an indication of the predicted remaining battery life;
in response to providing the indication of the predicted remaining battery life, receiving a user input to change at least one of a setting of the specific application or a setting of the device,
changing the at least one of the setting of the specific application or the setting of the device based on the user input;
identifying an amount of time elapsed between the battery state information being obtained and changing the at least one of the setting of the specific application or the setting of the device based on the user input;
predicting, by using the machine learning algorithm, an updated remaining battery life of the device on which the specific application is to be executed based on the changed setting and the identified amount of time; and
providing an indication of the updated remaining battery life based on the changed setting and the identified amount of time.

20. Apparatus for predicting a remaining battery life in a device, the apparatus comprising:
at least one processors; and
a memory configured to store computer program instructions which, when executed on the at least one processors, cause the at least one processors to:
obtain battery state information indicative of a current state of a charge of a battery, the battery being configured to supply power to a device;
predict, by using a machine learning algorithm, a remaining battery life of the device on which a specific application is to be executed, based on the obtained battery state information;
provide an indication of the predicted remaining battery life;
in response to the providing the indication of the predicted remaining battery life, receive a user input to change at least one of a setting of the specific application or a setting of the device;
change the at least one of the setting of the specific application or the setting of the device based on the user input;
identify an amount of time elapsed between the battery state information being obtained and changing the at least one of the setting of the specific application or the setting of the device based on the user input;
predict, by using the machine learning algorithm, an updated remaining battery life of the device on which the specific application is to be executed based on the changed setting and the identified amount of time; and
provide an indication of the updated remaining battery life based on the changed setting and the identified amount of time.

* * * * *